(12) United States Patent
Lee et al.

(10) Patent No.: US 11,762,292 B2
(45) Date of Patent: Sep. 19, 2023

(54) COATING COMPOSITIONS FOR USE WITH AN OVERCOATED PHOTORESIST

(71) Applicant: Rohm and Haas Electronic Materials Korea Ltd., Ghungcheongnam-Do (KR)

(72) Inventors: Sun-Jung Lee, Gyeonggi-Do (KR); Jihoon Kang, Seoul (KR); Dong-Je Hong, Gyeonggi-Do (KR)

(73) Assignee: ROHM AND HAAS ELECTRONIC MATERIALS KOREA LTD., Chungcheongnam-do (KR)

( * ) Notice: Subject to any disclaimer, the term of this patent is extended or adjusted under 35 U.S.C. 154(b) by 0 days.

(21) Appl. No.: 14/980,222

(22) Filed: Dec. 28, 2015

(65) Prior Publication Data
US 2016/0187778 A1  Jun. 30, 2016

Related U.S. Application Data

(60) Provisional application No. 62/097,667, filed on Dec. 30, 2014.

(51) Int. Cl.
| | | |
|---|---|---|
| *G03F 7/039* | (2006.01) | |
| *G03F 7/32* | (2006.01) | |
| *G03F 7/11* | (2006.01) | |

(52) U.S. Cl.
CPC .............. *G03F 7/0397* (2013.01); *G03F 7/11* (2013.01); *G03F 7/325* (2013.01)

(58) Field of Classification Search
None
See application file for complete search history.

(56) References Cited

U.S. PATENT DOCUMENTS

| | | | | | |
|---|---|---|---|---|---|
| 3,884,693 | A * | 5/1975 | Bauer | .................. | G03C 1/74 |
| | | | | | 430/160 |
| 4,421,516 | A * | 12/1983 | Stahl | .................. | D06P 5/12 |
| | | | | | 8/456 |
| 4,559,292 | A * | 12/1985 | Geissler | .................. | G03F 7/115 |
| | | | | | 430/256 |
| 5,232,813 | A * | 8/1993 | Okuno | .................. | G03F 7/0752 |
| | | | | | 430/156 |
| 5,994,031 | A * | 11/1999 | Hirai | .................. | G03F 7/322 |
| | | | | | 430/165 |
| 6,357,352 | B1 * | 3/2002 | Rorke | .................. | B41C 1/1033 |
| | | | | | 101/457 |
| 6,852,421 | B2 | 2/2005 | Wayton et al. | | |
| 6,964,839 | B1 * | 11/2005 | Choi | .................. | G03F 7/0397 |
| | | | | | 430/270.1 |
| 7,163,751 | B2 | 1/2007 | Wayton et al. | | |
| 7,402,372 | B2 * | 7/2008 | Hagihara | .............. | G03F 7/0392 |
| | | | | | 430/270.1 |
| 7,517,633 | B2 * | 4/2009 | Takei | .................. | C08L 25/18 |
| | | | | | 430/270.1 |
| 2002/0015917 | A1 * | 2/2002 | Lee | .................. | G03F 7/0045 |
| | | | | | 430/281.1 |
| 2002/0076642 | A1 * | 6/2002 | Zampini | .................. | G03F 7/091 |
| | | | | | 430/270.1 |
| 2003/0036016 | A1 * | 2/2003 | Szmanda | .................. | C23C 18/24 |
| | | | | | 205/667 |
| 2003/0146416 | A1 * | 8/2003 | Takei | .................. | C08L 25/18 |
| | | | | | 252/500 |
| 2003/0180559 | A1 * | 9/2003 | Wayton | .................. | C09D 167/00 |
| | | | | | 430/271.1 |
| 2003/0211407 | A1 * | 11/2003 | Watanabe | .................. | C09D 183/06 |
| | | | | | 430/17 |
| 2004/0110096 | A1 * | 6/2004 | Kishioka | .................. | C08G 18/791 |
| | | | | | 430/313 |
| 2004/0175653 | A1 * | 9/2004 | Zuang | .................. | G03F 7/033 |
| | | | | | 430/280.1 |
| 2004/0191705 | A1 * | 9/2004 | Sano | .................. | G03C 1/74 |
| | | | | | 430/464 |
| 2005/0260523 | A1 * | 11/2005 | Juan | .................. | G03F 7/0007 |
| | | | | | 430/270.1 |

(Continued)

FOREIGN PATENT DOCUMENTS

| | | | | | |
|---|---|---|---|---|---|
| JP | 2006276865 | A | * | 10/2006 | |
| JP | 2009-093162 | | * | 4/2009 | ............. G03F 7/11 |
| JP | 2012-022191 | | * | 2/2012 | ............. G03F 7/11 |
| KR | 20090046819 | A1 | * | 5/2009 | |
| WO | WO-2013018802 | A1 | * | 2/2013 | ............. C08G 73/06 |
| WO | WO-2014167671 | A1 | * | 10/2014 | ............. G03F 7/032 |

OTHER PUBLICATIONS

Triton X-100 data sheet (Sigma) (Apr. 1999, 2 pages).*

(Continued)

*Primary Examiner* — Martin J Angebranndt
(74) *Attorney, Agent, or Firm* — CANTOR COLBURN LLP

(57) ABSTRACT

Organic coating compositions, particularly antireflective coating compositions for use with an overcoated photoresist, are provided that comprise that comprise a surface agent of the Formula (I).

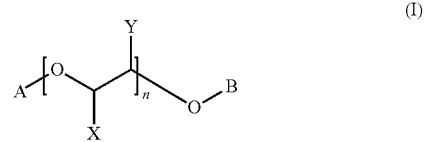

where A and B are each independently hydrogen, optionally substituted alkyl or optionally substituted aryl; X and Y are each independently hydrogen, optionally substituted alkyl or optionally substituted carbocyclic aryl; and n is a positive integer. Preferred coating compositions can provide improved pattern collapse margin of an overcoated photoresist layer.

15 Claims, No Drawings

(56) References Cited

U.S. PATENT DOCUMENTS

| | | | |
|---|---|---|---|
| 2005/0263021 A1* | 12/2005 | Mitsumoto | G03F 7/322 101/463.1 |
| 2006/0014100 A1* | 1/2006 | Yonemura | G03F 7/0392 430/270.1 |
| 2006/0057491 A1* | 3/2006 | Wayton | G03F 7/091 430/271.1 |
| 2006/0058468 A1* | 3/2006 | Wu | G03F 7/091 525/386 |
| 2006/0108710 A1* | 5/2006 | Xu | B82Y 10/00 264/293 |
| 2006/0210914 A1* | 9/2006 | Masuda | C08G 14/04 430/270.1 |
| 2007/0134916 A1* | 6/2007 | Iwabuchi | C08K 3/22 438/636 |
| 2007/0135581 A1* | 6/2007 | Takei | G03F 7/091 525/329.7 |
| 2007/0154821 A1* | 7/2007 | Galloway | B41C 1/05 430/7 |
| 2008/0193880 A1* | 8/2008 | Nishibe | G03F 7/40 430/286.1 |
| 2008/0286689 A1* | 11/2008 | Zhuang | C08G 65/2615 430/285.1 |
| 2008/0290314 A1* | 11/2008 | Lee | C03C 8/24 252/62.3 V |
| 2009/0297983 A1* | 12/2009 | Harwood, Jr. | B41C 1/1041 430/286.1 |
| 2009/0311624 A1* | 12/2009 | Horiguchi | G03F 7/091 430/271.1 |
| 2010/0092894 A1* | 4/2010 | Liu | G03F 7/091 430/325 |
| 2010/0304305 A1* | 12/2010 | Nakajima | G03F 7/091 430/316 |
| 2011/0033800 A1 | 2/2011 | Zampini et al. | |
| 2011/0033801 A1 | 2/2011 | Zampini et al. | |
| 2011/0200938 A1* | 8/2011 | Yao | G03F 7/091 430/280.1 |
| 2012/0070994 A1* | 3/2012 | Kanno | G03F 7/0752 438/703 |
| 2013/0337649 A1* | 12/2013 | Tachibana | G03F 7/094 438/694 |
| 2014/0048512 A1* | 2/2014 | Nakafuji | C08G 8/20 216/49 |
| 2015/0185614 A1* | 7/2015 | Sim | C09D 179/08 430/324 |
| 2015/0322219 A1* | 11/2015 | Someya | C09D 5/00 428/195.1 |
| 2016/0041470 A1* | 2/2016 | Kim | G03F 7/091 257/632 |
| 2016/0187781 A1* | 6/2016 | Kang | G03F 7/2041 430/325 |
| 2016/0230019 A1* | 8/2016 | Yao | H01L 21/02142 |
| 2017/0123319 A1 | 5/2017 | Ryu | G03F 7/11 |
| 2018/0095367 A1* | 4/2018 | Ryu | C09D 5/006 |

OTHER PUBLICATIONS

BARC Surface Property Matching for Negative-Tone Development of a Conventional Positive-Tone Photoresist—Proc. of SPIE, vol. 7972, 79720Q (2011).

* cited by examiner

COATING COMPOSITIONS FOR USE WITH AN OVERCOATED PHOTORESIST

BACKGROUND

The present invention relates to compositions and, in particular, antireflective coating compositions (for example, "BARCs"), for use in microelectronic applications. Compositions of the invention comprise a surface energy control agent.

Photoresists are photosensitive films used for the transfer of images to a substrate. A coating layer of a photoresist is formed on a substrate and the photoresist layer is then exposed through a photomask to a source of activating radiation. Following exposure, the photoresist is developed to provide a relief image that permits selective processing of a substrate.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer. See U.S. 2007/026458 and 2010/029556. See also Proceedings of SPIE, vol. 7972, 9720Q (2011).

Considerable effort has been made to extend the practical resolution capabilities of positive tone development, including in immersion lithography. One such example involves negative tone development (NTD) of a traditionally positive-type chemically amplified photoresist through use of particular developers, typically organic developers such as ketones, esters or ethers, leaving behind a pattern created by the insoluble exposed regions. See, for instance, U.S. Pat. No. 6,790,579.

Certain problems however can result with use of NTD processes. The developed photoresist pattern can, for example, demonstrate significant thickness loss as compared with the pre-exposed resist layer. This can give rise to pattern defects resulting from complete erosion of portions of the resist pattern during subsequent etching. The use of a thicker resist layer may not be a practical solution as other issues such as reduction in the depth of focus and pattern collapse can then result.

Electronic device manufacturers continually seek increased resolution of a photoresist image patterned over antireflective coating layers.

SUMMARY

We now provide new coating compositions that can be used with overcoated photoresist compositions. In preferred aspects, coating compositions of the invention can function as an effective antireflective layer for an overcoated resist layer.

Preferred coating compositions may comprise 1) a matrix polymer; and 2) a surface energy control agent that comprises a structure corresponding to the following Formula (I):

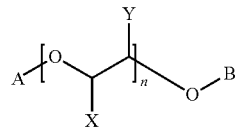

wherein A and B are each independently hydrogen, optionally substituted alkyl or optionally substituted aryl; X and Y are each independently hydrogen, optionally substituted alkyl or optionally substituted carbocyclic aryl; and n is a positive integer.

Preferred coating compositions can provide improved pattern collapse margin of an overcoated photoresist layer.

In particular, we have found that use of an underlying coating composition as disclosed herein can minimize occurrence of resist pattern collapse, particularly as may occur with negative tone development of an overcoated positive-tone resist. See, for instance, the results set forth in the Examples which follow.

Without being bound by any theory, we have found that the collapse margin of a positive-tone photoresist in a negative tone development (NTD) process can be dependent upon the surface energy of an underlayer, including a bottom anti-reflective coating (BARC).

We found that for a given photoresist the collapse margin can be maximized by using a BARC film with an optimal surface energy. Again without being bound by any theory, we consider that enhanced results (including decreased resist pattern collapse) can be achieved by adjusting a BARC film surface energy to be similar to the surface energy of the remaining (i.e. exposed photoresist) pattern in an NTD process.

For antireflective applications, underlying compositions of the invention also preferably contain a component that comprises chromophore groups that can absorb undesired radiation used to expose the overcoated resist layer from reflecting back into the resist layer. The matrix polymer or surface energy control agent may comprise such chromophore groups, or a coating composition may comprise a further component that comprises suitable chromophore groups.

In use with an overcoated photoresist, a coating composition may be applied on a substrate such as a semiconductor wafer which may have one or more organic or inorganic coating layers thereon. The applied coating layer may be optionally thermally treated prior to overcoating with a photoresist layer. Such thermal treatment may cause hardening including crosslinking of the coating composition layer. Such crosslinking may include hardening and/or covalent-bonding forming reactions between one or more composition components and can modulate water contact angle of the coating composition layer.

Thereafter, a photoresist composition may be applied over the coating composition layer followed by imaging of the applied photoresist composition layer with patterned activating radiation and the imaged photoresist composition layer is developed to provide a photoresist relief image.

A variety of photoresists may be used in combination (i.e. overcoated) with a coating composition of the invention. Preferred photoresists for use with the underlying coating compositions of the invention are chemically-amplified resists, especially negative-tone photoresists that contain one or more photoactive compounds and a resin component that contains units that undergo a deblocking or cleavage reaction in the presence of photogenerated acid.

In preferred aspects, the photoresist composition is designed for a negative-tone resist where the light-exposed regions remains after development process, but positive tone development can be also employed to remove the exposed portions of the photoresist layer.

The invention further provides methods for forming a photoresist relief image and novel articles of manufacture comprising substrates (such as a microelectronic wafer substrate) coated with a coating composition of the invention alone or in combination with a photoresist composition.

Other aspects of the invention are disclosed infra.

DETAILED DESCRIPTION

We now provide new organic coating compositions that are particularly useful with an overcoated photoresist layer. As discussed above, preferred coating compositions may comprise 1) a matrix polymer; and 2) a surface energy control agent. Preferred coating compositions of the invention may be applied by spin-coating (spin-on compositions) and formulated as a solvent composition. The coating compositions of the invention are especially useful as antireflective compositions for an overcoated photoresist and/or as planarizing or via-fill compositions for an overcoated photoresist composition coating layer.

Surface energy control agents for use in a coating composition as disclosed herein comprises a structure corresponding to the following Formula (I):

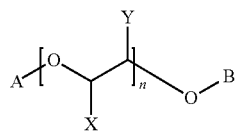

(I)

wherein A and B are each independently hydrogen, optionally substituted alkyl such as optionally substituted $C_{1-10}$ alkyl, or optionally substituted aryl such as optionally substituted carbocyclic aryl (e.g. phenyl, naphthyl and the like) or optionally substituted heteroaryl such as; X and Y are each independently hydrogen, optionally substituted alkyl such as optionally substituted $C_{1-10}$ alkyl, or optionally substituted carbocyclic aryl such as optionally substituted phenyl or optionally substituted naphthyl; and n is a positive integer, and n preferably may be 1 to about 20, 30, 40 50, 60, 70, 90 80, 100, 150 or 200 or more.

In certain aspects, at least one or both of A and B are suitably optionally substituted carbocyclic aryl such as optionally substituted phenyl or optionally substituted naphthyl. In certain aspects, one or more of A, B, X and/or Y are optionally substituted alkyl. In certain aspects, one or more of A, B, X and/or Y are hydrogen.

As referred to herein, a "heteroaryl" (as an optionally substituted aryl substituent A and/or B of Formula (I) above) includes an aromatic 5-8 membered monocyclic, 8-12 membered bicyclic, or 11-14 membered tricyclic ring system having 1-3 heteroatoms if monocyclic, 1-6 heteroatoms if bicyclic, or 1-9 heteroatoms if tricyclic, said heteroatoms selected from O, N, or S (e.g., carbon atoms and 1-3, 1-6, or 1-9 heteroatoms of N, O, or S if monocyclic, bicyclic, or tricyclic, respectively), wherein 0, 1, 2, 3, or 4 atoms of each ring may be substituted by a substituent. Examples of heteroaryl groups include pyridyl, furyl or furanyl, imidazolyl, benzimidazolyl, pyrimidinyl, thiophenyl or thienyl, quinolinyl, indolyl, thiazolyl, and the like.

Various materials and substituents (including groups A, B, X and Y of Formula (I) above) that are "optionally substituted" may be suitably substituted at one or more available positions by e.g. halogen (F, Cl, Br, I); nitro; hydroxy; amino; alkyl such as C14 alkyl; alkenyl such as $C_{2-8}$ alkenyl; alkylamino such as $C_{1-8}$ alkylamino; carbocyclic aryl such as phenyl, naphthyl, anthracenyl, etc; and the like.

Preferably, the matrix polymer and one or more surface control agents are distinct materials, i.e. the matrix polymer is responsible for the optical properties of the anti-reflective coating film, and the surface energy control agents for the modification of the surface property and the interfacial property with photoresist film. The matrix polymer optionally also can be covalently linked to at least one surface energy control agent during thermal treatment, but the formation of covalent bond is not essential in this invention.

Preferred surface energy control agents suitably may have a Mn of from about 40 to 200,000 or more. In generally preferred embodiment, a surface energy control agent may have an Mn of from about 100 or more such as 100 to 8000, 9000, or 10,000, more typically an Mn of from about 100, 200, 300, 400, 500 to about 1000, 2000, 3000, 4000 or 5000, with an Mn of from 300 to 5000 being particularly suitable for many compositions.

Particularly preferred surface control agents include poly (ethylene gycols) and ethers thereof, such as the following:

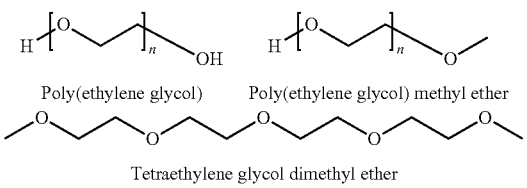

Poly(ethylene glycol)  Poly(ethylene glycol) methyl ether

Tetraethylene glycol dimethyl ether

One or more surface control agents are suitably present in a coating composition in an amount of from 0.1 weight percent to 10, 15, 20, 30, 40 or more weight percent based on weight of total solids of a coating composition, more typically from 1, 2, or 3 weight percent to 5, 10, 15, or 20 or more weight percent based on weight of total solids of a coating composition.

Preferred coating compositions of the invention will exhibit a decreased (lower number) static water contact angle relative to a comparable composition that does not contain the surface control agent. Preferred coating compositions exhibit significant (e.g. at least 10 degrees) reduction in water contact angle with use of relatively low amounts of a surface energy control agent. For instance, use of 2 or 3 weight percent of a surface energy control agent (weight percent based on total weight solids of a coating composition) can provide ca. 10 degree or more reduction in the water static contact angle of the applied coating composition (water static contact angle determined by the Water Static Contact Angle Measurement Protocol as specified in the examples which follow).

A variety of resins may serve as the matrix polymer of an underlying coating composition.

Particularly preferred matrix resins of coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

Matrix resins of coating compositions of the invention may comprise a variety of additional groups such as cyanurate groups, as disclosed in U.S. Pat. Nos. 6,852,421 and 8,501,383.

Particularly preferred matrix resins of coating compositions of the invention may comprise one or more one or more cyanurate groups and polyester linkages.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in a coating composition employed with a photoresist imaged at sub-200 nm wavelengths such as 193 nm. An isocyanurate compound also may be polymerized with one or more polyols to provide a resin useful in the present underlying coating compositions. Resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{i\_6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating compositions that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contains phenyl, anthracene, naphthyl, etc. units. It is often preferred, however, that the one or more resins that provide water contact angle modulation also contain chromophore moieties.

Preferably matrix resins of underlying coating compositions of the invention will have a weight average molecular weight (Mw) of about 1,000 to about 10,000,000 daltons, more typically about 2,000 to about 100,000 daltons, and a number average molecular weight (Mn) of about 500 to about 1,000,000 daltons. Molecular weights (either Mw or Mn) of the polymers of the invention are suitably determined by gel permeation chromatography.

The matrix polymer will be the major solids component of an underlying coating composition in many preferred embodiments. For instance, the matrix polymer suitably may be present from 50 to 99.9 weight percent based on total solid content of a coating composition, more typically from 80 to 95 weight percent based total solid content of a coating composition. As referred to herein, solids of a coating composition refer to all materials of the coating composition except solvent carrier.

As mentioned, preferred underlying coating compositions of the invention can be crosslinked, e.g. by thermal and/or radiation treatment. For example, preferred underlying coating compositions of the invention may contain a separate crosslinker component that can crosslink with one or more other components of the coating composition. Generally preferred crosslinking coating compositions comprise a separate crosslinker component.

A variety of crosslinkers may be employed, including those crosslinkers disclosed in European Application 542008. For example, suitable coating composition crosslinkers include amine-based crosslinkers such as melamine materials, including melamine resins such as manufactured by Cytec Industries and sold under the tradename of Cymel 300, 301, 303, 350, 370, 380, 1116 and 1130. Glycolurils are particularly preferred including glycolurils available from Cytec Industries. Benzoquanamines and urea-based materials also will be suitable including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of a coating composition of the invention in general is present in an amount of between about 5 and 50 weight percent of total solids (all components except solvent carrier) of the coating composition, more typically in an amount of about 5 to 25 weight percent total solids.

Particularly preferred coating compositions of the invention also may contain a thermal acid generator compound. Thermal-induced crosslinking of the coating composition by activation of the thermal acid generator is generally preferred.

Suitable thermal acid generator compounds for use in a coating composition include ionic or substantially neutral thermal acid generators, e.g. an ammonium arenesulfonate salt (e.g. toluene sulfonic acid ammonium salt), for catalyzing or promoting crosslinking during curing of an antireflective composition coating layer. Typically one or more thermal acid generators are present in an coating composition in a concentration from about 0.1 to 10 percent by weight of the total of the dry components of the composition (all components except solvent carrier), more preferably about 0.5 to 2 percent by weight of the total dry components.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6261743 for a discussion of such use of a photoacid generator in an antireflective composition.

To make a liquid coating composition of the invention, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solid content of an underlying coating composition varies from about 0.5 to 20 weight percent of the total weight of the coating composition, preferably the solid content varies from about 0.5 to 10 weight of the coating composition.

Exemplary Photoresist Ssystems

Photoresists for use with an underlying coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the following formula (V), a lactone-containing monomer of the following formula (VI), a base-soluble monomer of the following formula (VII) for adjusting dissolution rate in alkaline developer, and an acid-generating monomer of the following formula (VIII), or a combination comprising at least one of the foregoing monomers:

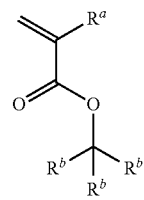

(V)

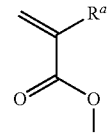

(VI)

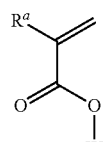

(VII)

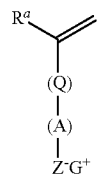

(VIII)

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the acid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

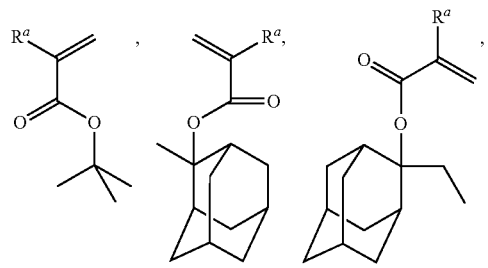

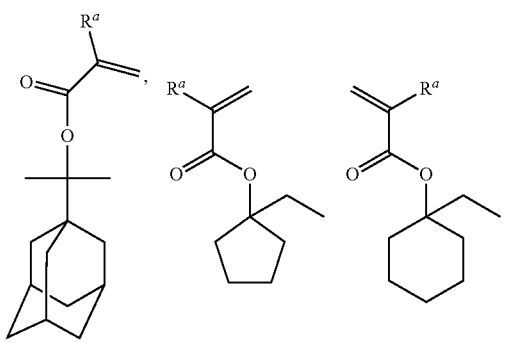

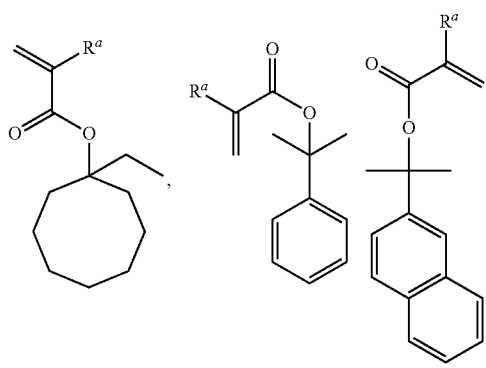

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

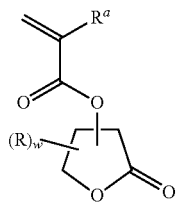

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

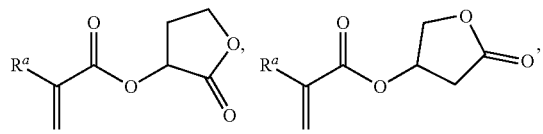

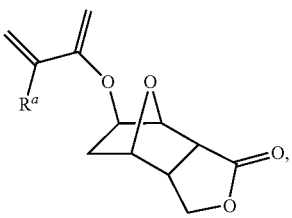

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

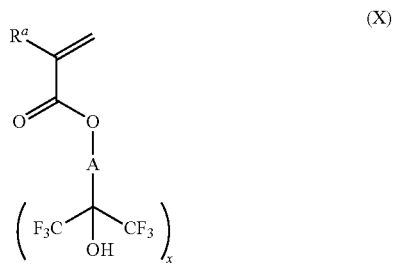

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

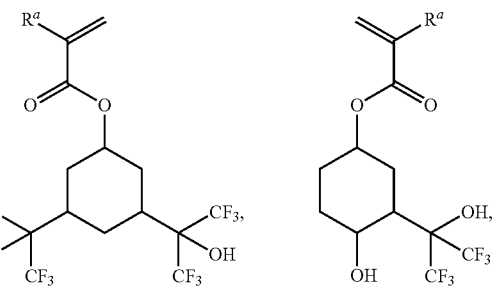

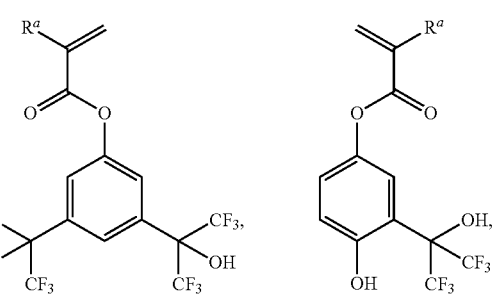

-continued

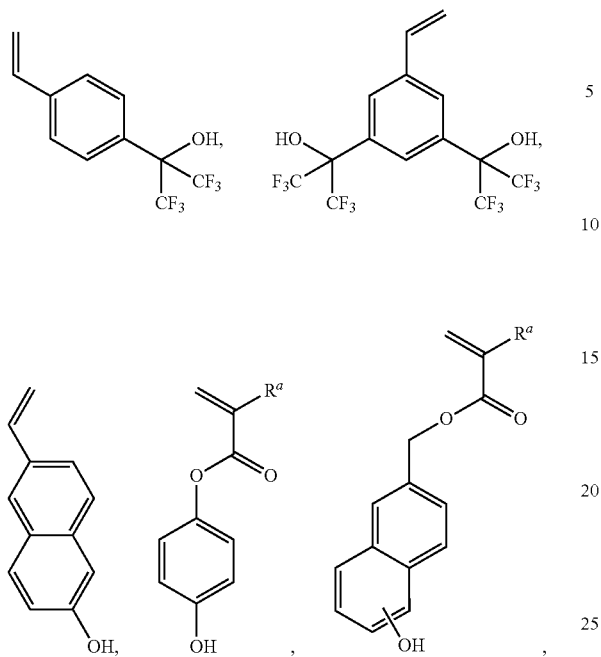

or a combination comprising at least one of the foregoing, wherein $R^a$ is H, F, —CN, $C_{1-6}$ alkyl, or $C_{1-6}$ fluoroalkyl.

Preferred acid generating monomers include those of the formulae (XI) or (XII):

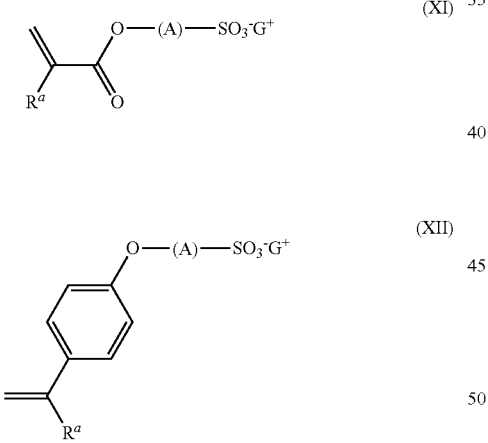

wherein each $R^a$ is independently H, F, —CN, $C_{1-6}$alkyl, or $C_{1-6}$ fluoroalkyl, A is a fluorine-substituted $C_{1-30}$alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[$C(R^1)_2$)xC(=O)O]$_b$—C(($R^2)_2$)$_y$(CF$_2$)z- group, or an o-, m- or p-substituted —$C_6F_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred acid generating monomers include:

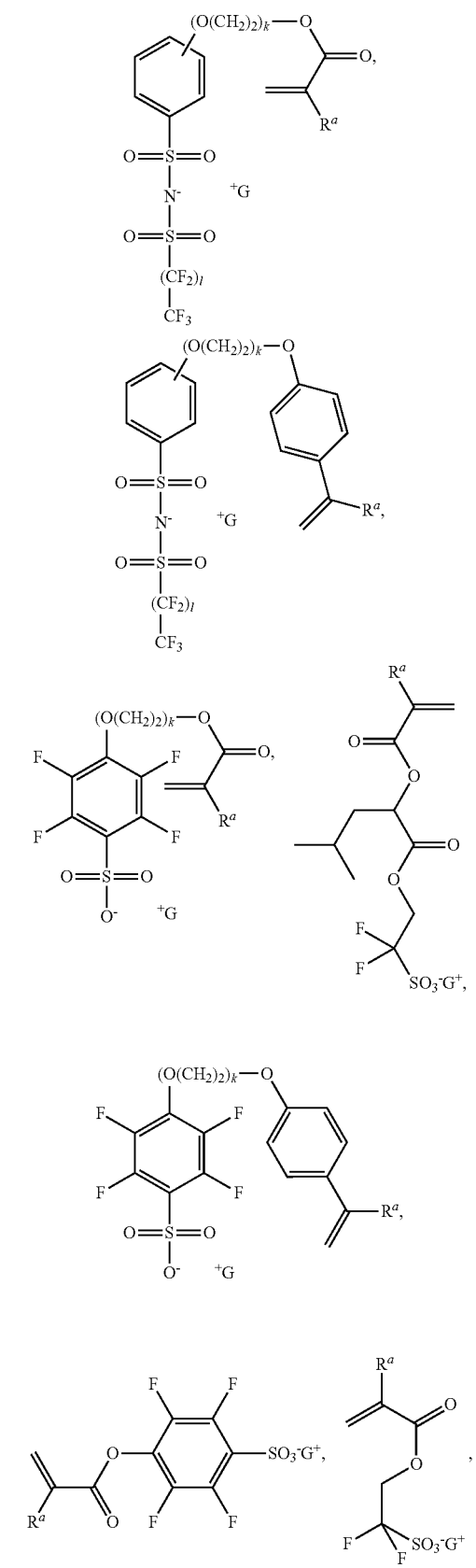

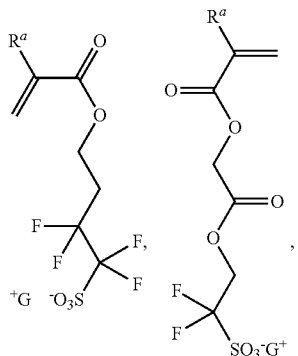

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation. $G^+$ as referred to herein throughout the various formulae may be an acid generator as disclosed herein and comprise an oxo-dioxolane moiety and/or an oxo-dioxane moiety.

Preferred acid-generating monomers may include sulfonium or iodonium cation. Preferably, in formula (IV), $G^+$ is of the formula (XIII):

(XIII)

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

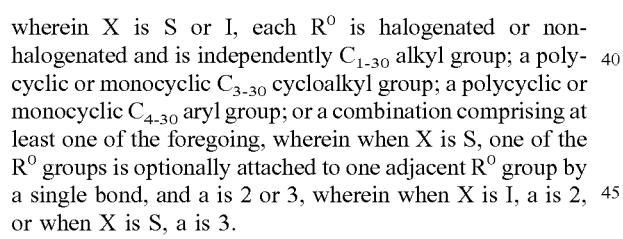

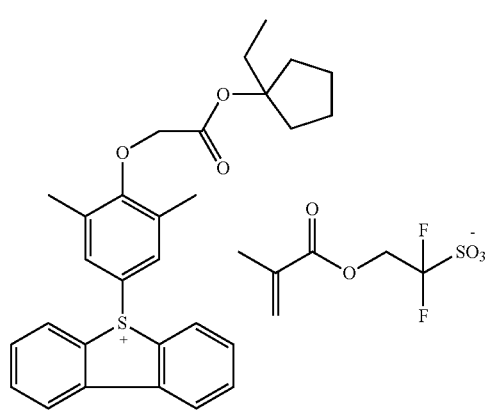

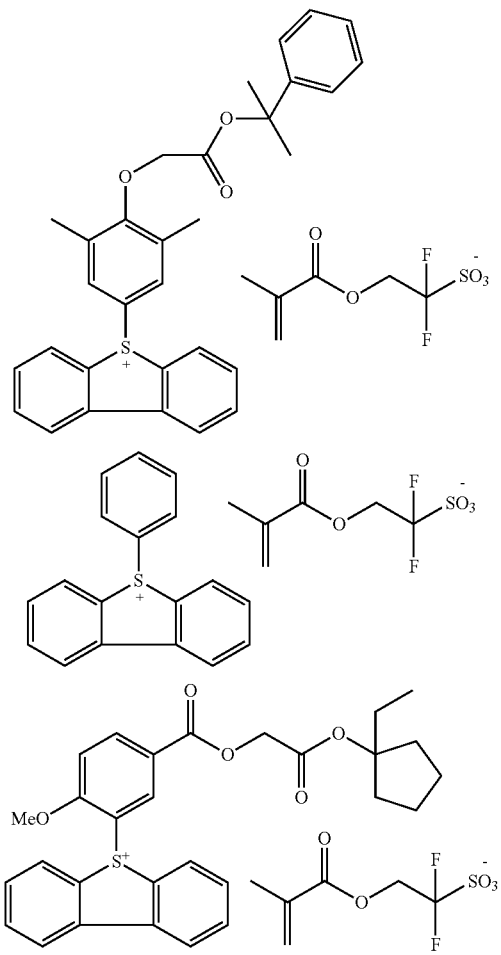

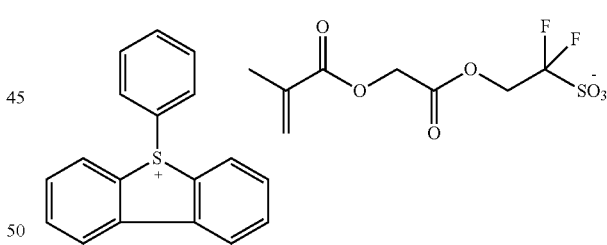

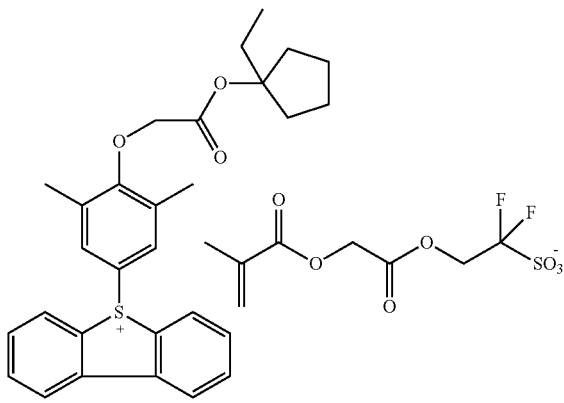

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Additional preferred resins for use in photoresists to be imaged at sub-200 nm, such as at 193 nm, comprises units of the following general formulae (I), (II) and (III): Preferred resins for use in photoresists to be imaged at sub-200 nm, such as at 193 nm, comprise units of the following general formulae (I), (II) and (III):

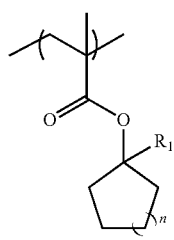

(I)

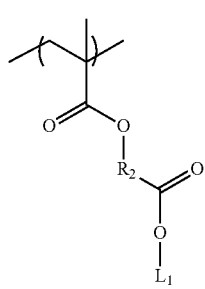

(II)

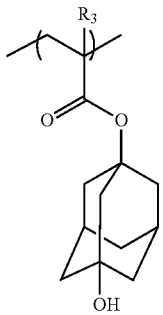

(III)

wherein: $R_1$ is a $(C_1\text{-}C_3)$alkyl group; $R^2$ is a $(C_1\text{-}C_3)$alkylene group; Li is a lactone group; and n is 1 or 2.

Polymers for use in photoresists of the invention may suitably vary widely in molecular weight and polydisperity. Suitable polymers include those that have an $M_w$, of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy) benzene, and 1,2,3-tris(p-toluenesulfonyloxy)benzene; diazomethane derivatives, for example, bis(benzenesulfonyl) diazomethane, bis(p-toluenesulfonyediazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis (2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 5 minutes. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

The following non-limiting examples are illustrative of the invention.

EXAMPLE 1

Synthesis of Matrix Polymer 1

A polymer referred to herein as "Matrix Polymer 1" or simply "Polymer 1" is prepared as follows. 14 g of dibutyl 3,3'-(5-(2-(tert-butoxy)-2-oxoethyl)-2,4,6-trioxo-1,3,5-triazinane-1,3-diyl)dipropionate, 27 g of Tris-(2-hydroxyethyl) isocyanurate, catalytic amount of p-toluenesulfonic acid monohydrate and 33 g of Anisole were charged into the reactor. The reaction was heated and refluxed. After the reaction was completed, the reaction solution was cooled and diluted. The solution was added into sufficient amounts of alcoholic solvent and collected by filtration in a Buchner funnel, air-dried, and then dried in vacuum. The resulting polymer had a weight average molecular weight of 9000 in terms of standard polystyrene.

EXAMPLE 2

Synthesis of Matrix Polymer 2

A polymer referred to herein as "Matrix Polymer 2" or simply "Polymer 2 is prepared as follows. 17 g of Tris-(2-carboxylethyl) Isocyanurate, 23 g of Tris-(2-hydroxyethyl) Isocyanurate, catalytic amount of p-toluenesulfonic acid monohydrate and 33 g of Anisole were charged into the reactor. After the reaction was completed, the reaction solution was cooled and diluted. The polymer was precipitated by dropping into sufficient amount of isopropyl alcohol and collected by filtration in a Buchner funnel, air-dried, and then dried in vacuum. The resulting polymer had a weight average molecular weight of 7000 in terms of standard polystyrene.

EXAMPLE 3

Synthesis of Matrix Polymer 3

A polymer referred to herein as "Matrix Polymer 3" or simply "Polymer 3 is prepared as follows. 15 g of N-allyl-bis(2-carboxylethyl)Isocyanurate, 27 g of Tris-(2-hydroxyethyl)Isocyanurate, catalytic amount of p-toluenesulfonic acid monohydrate (PTSA) and 30 g of Anisole were charged into the reactor. After the reaction was completed, the reaction solution was cooled and diluted. The polymer was precipitated by dropping into sufficient amount of alcoholic solvent and collected by filtration in a Buchner funnel, air-dried, and then dried in vaccum. The resulting polymer had a weight average molecular weight of 19000 in terms of standard polystyrene.

EXAMPLE 4

Synthesis of Matrix Polymer 4

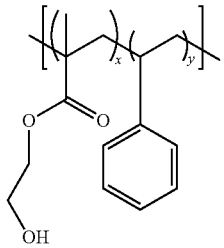

A polymer of the structure shown immediately above (referred to herein as "Matrix Polymer 4" or simply "Polymer 4) is prepared as follows. Charge 50 g of 1-butanol into 3-neck 250 ml round bottom flask equipped with a thermal controller and then purge with nitrogen. Heat the reactor until temperature of the reaction mixture reached 80° C., the feeding solution (feeding solution specified below) was fed into the reactor with a feeding rate of 0.92ml/min for a total feeding time of ~60 minutes. After feeding completed, the reactor was maintained at 80° C. for additional 1 hour, the heating was then removed and allow the reactor to cool down to room temperature with stirring naturally. Polymer solution was precipitated by methyl alcohol (10x excess of reaction mixture) and then filtrated and vacuum dried.
Preparation of Feeding Solution:
Weigh the following amount of each of the materials into a suitable container: 1) 48.14 g of styrene monomer (liquid); 2) 1.86 g of 2-hydroxyethyl methacrylate monomer (liquid).

Slightly shake the bottle to mix two monomers and place the bottle in an ice bath to let temperature of mixture reach equilibrium with the ice bath. Add 1.373 g of V601 initiator (white powder) into the bottle, and shake the bottle to dissolve the initiator completely. Place the bottle back to the ice bath.

EXAMPLES 5-31 and COMPARATIVE EXAMPLES 1-4

Preparation of Coating Compositions and Water Static Contact Angle (Water SCA)

In the following Examples 5-31 and Comparative Examples 1-4 which are summarized in Table I below, underlying coating compositions were prepared by admixing the specific components and crosslinker (tetramethoxymethylglycouril, TMGU) and acid cure catalyst. Water static contact angles (water SCA) were determined for each coating composition by the Water Static Contact Angle Measurement Protocol specified below.

In Table 1 below, PEG300 designates poly(ethyleneglycol) having Mn of 300; PEG600 designates poly(ethyleneglycol) having Mn of 600; PEG1500 designates poly(ethyleneglycol) having Mn of 1500; PEGME750 designates poly(ethyleneglycol)methyl ether having Mn of 750; and PPG725 designates poly(propyleneglycol) having Mn of 725, where references to poly(ethyleneglycol), poly(ethyleneglycol) methyl ether and tetraethylene glycol dimethyl ether designate the following structures:

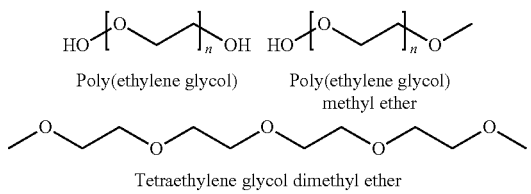

Poly(ethylene glycol)     Poly(ethylene glycol) methyl ether

Tetraethylene glycol dimethyl ether

In Table 1 below, SECA wt % refers to the weight percent of the specified surface energy control agent based on total weight of total solids of the formulated coating composition (total solids being all components except solvent carrier).

TABLE 1

Formulation Examples and water static contact angle (water SCA) results

| | Polymer | Surface energy control agent (SECA) | SECA wt % | Water SCA |
|---|---|---|---|---|
| Comparative 1 | Polymer 1 | — | | 63 |
| Example 5 | Polymer 1 | PEG300 | 3% | 61.4 |
| Example 6 | Polymer 1 | PEG300 | 6% | 60.3 |
| Example 7 | Polymer 1 | PEG300 | 12% | 58.6 |
| Example 8 | Polymer 1 | PEG300 | 15% | 57.6 |
| Example 9 | Polymer 1 | PEG600 | 3% | 60.5 |
| Example 10 | Polymer 1 | PEG1500 | 3% | 51.8 |
| Example 11 | Polymer 1 | PEG1500 | 6% | 46.7 |
| Example 12 | Polymer 1 | PEG1500 | 9% | 46.9 |
| Example 13 | Polymer 1 | PEG1500 | 12% | 47.4 |
| Example 14 | Polymer 1 | PEG1500 | 15% | 46.9 |
| Example 15 | Polymer 1 | PEGME7500 | 3% | 54.6 |
| Example 16 | Polymer 1 | PEGME7500 | 6% | 48.0 |
| Example 17 | Polymer 1 | PEGME7500 | 9% | 47.4 |
| Example 18 | Polymer 1 | Tetraethylene glycol dimethyl ether | 15% | 64.0 |
| Example 19 | Polymer 1 | PPG725 | 3% | 58.0 |
| Example 20 | Polymer 1 | PPG725 | 6% | 57.2 |
| Example 21 | Polymer 1 | PPG725 | 9% | 57.3 |
| Comparative 2 | Polymer 2 | — | | 68.0 |
| Example 22 | Polymer 2 | PEGME7500 | 3% | 57.0 |
| Example 23 | Polymer 2 | PEGME7500 | 6% | 54.0 |
| Example 24 | Polymer 2 | PEGME7500 | 9% | 54.0 |

TABLE 1-continued

Formulation Examples and water static contact angle (water SCA) results

| | Polymer | Surface energy control agent (SECA) | SECA wt % | Water SCA |
|---|---|---|---|---|
| Example 25 | Polymer 2 | PEGME7500 | 15% | 53.0 |
| Comparative 3 | Polymer 3 | — | | 66.0 |
| Example 26 | Polymer 3 | PEGME7500 | 3% | 55.0 |
| Example 27 | Polymer 3 | PEGME7500 | 6% | 52.0 |
| Comparative 4 | Polymer 4 | — | | 63.7 |
| Example 28 | Polymer 4 | PEGME7500 | 3% | 63.1 |
| Example 29 | Polymer 4 | PEGME7500 | 6% | 62.6 |
| Example 30 | Polymer 4 | PEGME7500 | 9% | 61.5 |
| Example 31 | Polymer 4 | PEGME7500 | 15% | 57.9 |

EXEMPLARY FORMULATION PROTOCOLS (EXAMPLES 5, 12, 22)

EXAMPLE 5

0.812 g of Polymer 1 (as prepared in Example 1 above), 0.03 g of PEG300 (poly(ethyleneglycol) having Mn of 300 as specified above), 0.15 g of TMGU as a crosslinking agent, and 0.008 g of pTSA•NH3 as a thermal acid catalyst were mixed, and to the mixture 99 g of HBM was added as a solvent. Then, the solution was filtered through a 0.45μm PTFE filter.

EXAMPLE 12

0.752 g of Polymer 1 (as prepared in Example 1 above), 0.09 g of PEG1500 (poly(ethyleneglycol) having Mn of 1500 as specified above), 0.15 g of TMGU as a crosslinking agent, and 0.008 g of pTSA•NH3 as a thermal acid catalyst were mixed, and to the mixture 99 g of HBM was added as a solvent. Then, the solution was filtered through a 0.45 μm PTFE filter.

EXAMPLE 22

0.692 g of Polymer 2 (as prepared in Example 2 above), 0.15 g of PEGME750 (poly(ethyleneglycol)methyl ether having Mn of 750 as specified above), 0.15 g of TMGU as a crosslinking agent, and 0.008 g of pTSA•NH3 as a thermal acid catalyst were mixed, and to the mixture 99 g of HBM was added as a solvent. Then, the solution was filtered through a 0.45 μm PTFE filter.

Water Static Contact Angle Measurement Protocol 200 nm wafer silicon wafers were spin coated with the fluid coating composition prepared from Examples 5-31 and Comparative Examples 1-4. The wafer was baked for 60 seconds at 205° C., yielding a BARC film thickness of 250A. 4.5 μm size of water was disposed on the coated wafers by Krüss DSA100 and the static contact angle measured. This contact angle measurement protocol is referred elsewhere herein as the Water Static Contact Angle Measurement Protocol.

EXAMPLE 32

Additional Water Static Contact Angle

Surface energy control agents of poly(ethylene glyocol) and poly(ethylene glyocol) methyl ether were formulated with polyester matrix polymers in varying amounts and water static contact angles were determined by the Water Static Contact Angle Measurement Protocol as specified above. Results are set forth in the following Table 2, where the amounts of the specified surface energy control agent are expressed as weight percent relative to weight of total solids of the coating composition (i.e. the specified surface energy control agent and the polyester matrix resin).

TABLE 2

| Surface energy control agent loading wt % | Poly(ethylene glycol) | Poly(ethylene glycol) methyl ether |
|---|---|---|
| 0 | 63.0 | 62.6 |
| 3 | 51.8 | 49.0 |
| 6 | 48.7 | 46.0 |
| 9 | 46.9 | — |
| 12 | 47.4 | — |
| 15 | 46.9 | 45.9 |

EXAMPLE 33

Lithography 300 mm HMDS-primed silicon wafers were spin-coated with ARTM26N (Rohm and Haas Electronic Materials) to form a first bottom anti-reflective coating (BARC) on a TEL CLEAN TRAC LITHIUS i+, followed by the bake process for 60 seconds at 205° C., providing the first BARC layer thickness of 900 Å.

Second BARC layers—which were underlying coating compositions containing a surface energy control agent of Formula (I) as disclosed herein-were then coated over the first BARC film and baked at 205° C. for 60 seconds, whose thickness ranges from 170 Å to 200 Å. The film thickness of the second BARC layer was adjusted for the reflectivity minimum depending on the layer optical parameters. Upon the dual BARC films, a NTD photoresist was spin-coated and soft-baked at 100° C. for 60 seconds. The NTD photoresist contained a first polymer with photoacid-labile groups, a photoacid generator compound, an amine quencher compound, a second polymer that was a fluorinated resin and solvent. The first polymer was a copolymer of isopropyladamantyl methacrylate/isopropylcyclopropyl methacrylate/r-butyrolactone methacrylate/hydroxyadamantyl methacrylate (20/25/30/25) as depicted in the following formula:

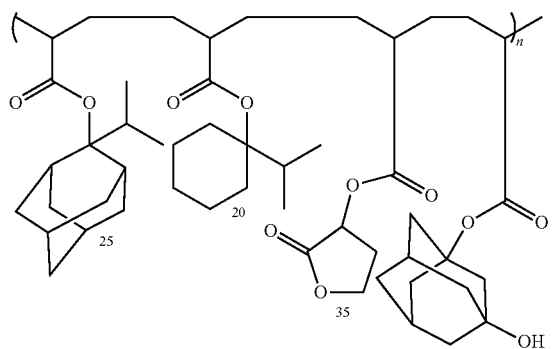

The photoresist photoacid generator compound was triphenylsulfonium perfluorobutylsulfonate present in an amount of 6.0 weight % based on total solids (all photoresist materials except solvent). The photoresist quencher compound was trioctyl amine present in an amount of 1.3 weight % based on total solids. The photoresist solvent was propyleneglycolmonomethylether acetate/methyl-2-hydroxyisobutyrate at 50:50 relative volume percent.

The fabricated films were then exposed through a mask on Nikon S306C ArF immersion scanner using the illumination conditions as follows: 1.3 NA, dipole-35Y with X-polarization, 5 0.74 -0.95. The exposure dose was varied from 23.0 mJ/cm² to 47.0 mJ/cm² by 1 mJ/cm². The exposed film was then post-exposure baked at 90° C. for 60 seconds, followed by the developing with n-butyl acetate for 90 seconds using a TEL CLEAN TRAC LITHIUS i+, which provides the patterns with negative tone development. Critical dimensions (CDs) of the patterns of interests (41 nm 1:1 line/space, 82 nm pitch, dark field phase-shifted by 180° with transmittance 0.06) were measured on a Hitachi CG4000 CD SEM. Pattern collapse margin of a BARC was determined as the smallest pattern CD which was printed from a BARC as the exposure dose decreases.

The comparison of the pattern collapse margins between BARCs are summarized in Table 2 below. AR™ 147 anti-reflective coating (BARC commercially available from Dow Chemical) was used as a reference. For clear comparison, the differences in the min. CD from the reference AR™ 147, D(min. CD, min. CD with AR™ 147) are shown. Therefore, the more negative Δ represents better collapse margin.

TABLE 3

| | Surface energy control agent (SECA) | Amount SECA (w.t. % in solid) | Δ collapse margin to AR ™147 |
|---|---|---|---|
| AR ™147 | None | | |
| Polymer 1 | None | 0% | −4.78 |
| | PEGME-750 | 3% | −6.43 |
| | | 9% | −6.65 |
| Polymer 2 | PEGME-750 | 0% | −1.99 |
| | | 3% | −5.21 |
| | | 6% | −3.76 |
| | | 9% | −3.52 |
| Polymer 1 | PEG-600 | 3% | −5.02 |
| | PEG-1500 | 3% | −6.46 |
| | PPG-725 | 3% | −4.03 |

What is claimed is:

1. A method for forming a photoresist relief image, comprising:

a) applying on a substrate a layer of a coating composition comprising 1) a matrix polymer that comprises polyester linkages; 2) a surface energy control agent; 3) a crosslinking agent; and 4) a thermal acid generator, wherein the coating composition does not comprise fluorine;

b) thermally treating the applied coating composition layer; and thereafter c) applying a layer of a photoresist composition above the coating composition layer, wherein the surface energy control agent comprises a structure corresponding to the following Formula (I):

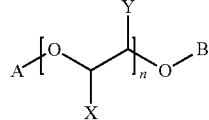
(I)

wherein A and B are each independently hydrogen, or optionally substituted alkyl, provided that at least one or A and B is not hydrogen;

X and Y are each independently hydrogen, optionally substituted alkyl or optionally substituted carbocyclic aryl; and n is a positive integer, and the surface energy control agent has a number average molecule weight of 300 to 1,000.

2. The method of claim 1 wherein the photoresist composition is imaged with activating radiation and the imaged photoresist composition layer is developed to provide a photoresist relief image.

3. The method of claim 2 wherein a developer is applied to the imaged photoresist composition layer and unexposed portions of the photoresist layer are removed by the developer.

4. The method of claim 1 wherein the coating composition comprises the surface energy control agent in an amount of 1 weight percent to 10 weight percent based on total solid content of the coating composition.

5. The method of claim 1 wherein the surface energy control agent is a poly(ethylene glycol)methyl ether.

6. The method of claim 1 wherein the matrix polymer further comprises cyanurate groups.

7. The method of claim 1 further comprising imaging the photoresist composition layer with 193 nm activating radiation.

8. The method of claim 1 further comprising imaging the photoresist composition layer with EUV radiation.

9. The method of claim 1 wherein substituents of the substituted alkyl of A and B are selected from the group consisting of halogen, nitro, hydroxy, amino, alkyl, alkenyl, alkylamino, and carbocyclic aryl.

10. A coated substrate comprising:

a substrate having thereon:

1) a coating composition comprising a) a matrix polymer that comprises polyester linkages; b) a surface energy control agent, c) a crosslinking agent; and d) a thermal acid generator, wherein the coating composition does not comprise fluorine; and 2) a layer of a photoresist composition above the coating composition layer, wherein the surface energy control agent comprises a structure corresponding to the following Formula (I):

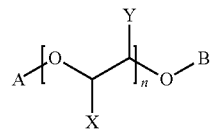
(I)

wherein A and B are each independently hydrogen, or optionally substituted alkyl, provided that at least one or A and B is not hydrogen, and wherein substituents of the substituted alkyl of A and B are selected from the group consisting of halogen, nitro, hydroxy, amino, alkyl, alkenyl, alkylamino, and carbocyclic aryl;

X and Y are each independently hydrogen, optionally substituted alkyl or optionally substituted carbocyclic aryl; and n is a positive integer, and the surface energy control agent has a number average molecular weight of 300 to 1,000.

11. The substrate of claim 10 wherein the matrix polymer further comprises cyanurate groups.

12. A coating composition for use with an overcoated photoresist composition layer, the coating composition comprising:

1) a crosslinker agent;
2) a matrix polymer comprising polyester linkages;
3) a surface energy control agent which is distinct from the matrix polymer and comprising a structure corresponding to the following Formula (I):

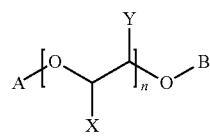
(I)

wherein A and B are each independently hydrogen, or optionally substituted alkyl, provided that at least one or A and B is not hydrogen, and wherein substituents of the substituted alkyl of A and B are selected from the group consisting of halogen, nitro, hydroxy, amino, alkyl, alkenyl, alkylamino, and carbocyclic aryl;

X and Y are each independently hydrogen, optionally substituted alkyl or optionally substituted carbocyclic aryl; and n is a positive integer, the surface energy control agent has a number average molecular weight of 300 to 1,000, and 4) a thermal acid generator.

wherein the coating composition does not comprise fluorine.

13. The coating composition of claim 12 wherein the coating composition is formulated with a solvent carrier.

14. The coating composition of claim 12 wherein the surface energy control agent is a poly(ethylene glycol) methyl ether.

15. The composition of claim 12 wherein the matrix polymer comprises cyanurate groups.

* * * * *